United States Patent
Schulze et al.

(10) Patent No.: US 9,876,004 B2
(45) Date of Patent: *Jan. 23, 2018

(54) SEMICONDUCTOR COMPONENT INCLUDING A SHORT-CIRCUIT STRUCTURE

(71) Applicant: Infineon Technologies AG, Neubiberg (DE)

(72) Inventors: Hans-Joachim Schulze, Taufkirchen (DE); Franz-Josef Niedernostheide, Muenster (DE); Uwe Kellner-Werdehausen, Leutenbach (DE); Reiner Barthelmess, Soest (DE)

(73) Assignee: Infineon Technologies AG, Neubiberg (DE)

( * ) Notice: Subject to any disclaimer, the term of this patent is extended or adjusted under 35 U.S.C. 154(b) by 30 days.

This patent is subject to a terminal disclaimer.

(21) Appl. No.: 15/016,992

(22) Filed: Feb. 5, 2016

(65) Prior Publication Data

US 2016/0155735 A1  Jun. 2, 2016

Related U.S. Application Data

(63) Continuation of application No. 12/324,309, filed on Nov. 26, 2008, now Pat. No. 9,269,769.

(30) Foreign Application Priority Data

Nov. 30, 2007  (DE) .................... 10 2007 057 728 U

(51) Int. Cl.
*H01L 27/02* (2006.01)
*H01L 29/36* (2006.01)
(Continued)

(52) U.S. Cl.
CPC ........ *H01L 27/0255* (2013.01); *H01L 21/324* (2013.01); *H01L 29/0692* (2013.01);
(Continued)

(58) Field of Classification Search
CPC ............................................ H01L 2924/13024
See application file for complete search history.

(56) References Cited

U.S. PATENT DOCUMENTS

| 4,417,385 A | 11/1983 | Temple |
| 4,935,798 A | 6/1990 | Nishizawa et al. |

(Continued)

FOREIGN PATENT DOCUMENTS

| DE | 101 22 361 | 11/2002 |
| DE | 102 10 138 | 10/2003 |
| DE | 10296970 | 7/2004 |

*Primary Examiner* — Phat X Cao
*Assistant Examiner* — Diana C Vieira
(74) *Attorney, Agent, or Firm* — Dicke, Billig & Czaja, PLLC

(57) ABSTRACT

A semiconductor component including a short-circuit structure. One embodiment provides a semiconductor component having a semiconductor body composed of doped semiconductor material. The semiconductor body includes a first zone of a first conduction type and a second zone of a second conduction type, complementary to the first conduction type, the second zone adjoining the first zone. The first zone and the second zone are coupled to an electrically highly conductive layer. A connection zone of the second conduction type is arranged between the second zone and the electrically highly conductive layer.

13 Claims, 12 Drawing Sheets

(51) Int. Cl.

| | |
|---|---|
| *H01L 29/167* | (2006.01) |
| *H01L 21/324* | (2006.01) |
| *H01L 29/861* | (2006.01) |
| *H01L 29/66* | (2006.01) |
| *H01L 29/74* | (2006.01) |
| *H01L 29/06* | (2006.01) |
| *H01L 29/739* | (2006.01) |
| *H01L 29/165* | (2006.01) |
| *H01L 29/08* | (2006.01) |
| *H01L 27/102* | (2006.01) |
| *H01L 29/10* | (2006.01) |

(52) U.S. Cl.
CPC ...... *H01L 29/0834* (2013.01); *H01L 29/0839* (2013.01); *H01L 29/165* (2013.01); *H01L 29/167* (2013.01); *H01L 29/36* (2013.01); *H01L 29/66136* (2013.01); *H01L 29/66363* (2013.01); *H01L 29/7395* (2013.01); *H01L 29/7428* (2013.01); *H01L 29/861* (2013.01); *H01L 27/1027* (2013.01); *H01L 29/083* (2013.01); *H01L 29/1012* (2013.01); *H01L 29/1016* (2013.01); *H01L 2924/0002* (2013.01)

(56) References Cited

U.S. PATENT DOCUMENTS

| | | |
|---|---|---|
| 5,142,347 A | 8/1992 | Voss |
| 5,196,366 A | 3/1993 | Yamazaki et al. |
| 5,610,415 A | 3/1997 | Schulze |
| 5,644,149 A | 7/1997 | Streit |
| 6,727,526 B1 | 4/2004 | Niedernostheide et al. |
| 7,271,040 B2 | 9/2007 | Tanaka |
| 7,456,068 B2 | 11/2008 | Kavalieros et al. |
| 7,479,657 B2 | 1/2009 | Suzawa |
| 7,501,666 B2 | 3/2009 | Tanabe et al. |
| 7,504,288 B1 | 3/2009 | Zhang et al. |
| 7,548,364 B2 | 6/2009 | Jennings |
| 2001/0040255 A1* | 11/2001 | Tanaka ............... H01L 29/083 257/342 |
| 2002/0125548 A1 | 9/2002 | Nagasu et al. |
| 2004/0056702 A1 | 3/2004 | Nagasu et al. |
| 2004/0169220 A1 | 9/2004 | Takemori |
| 2005/0032323 A1 | 2/2005 | Chen et al. |
| 2008/0146014 A1 | 6/2008 | Ding |
| 2008/0206942 A1 | 8/2008 | Ting et al. |
| 2008/0242039 A1 | 10/2008 | Ku et al. |
| 2014/0070271 A1 | 3/2014 | Takahashi et al. |

\* cited by examiner

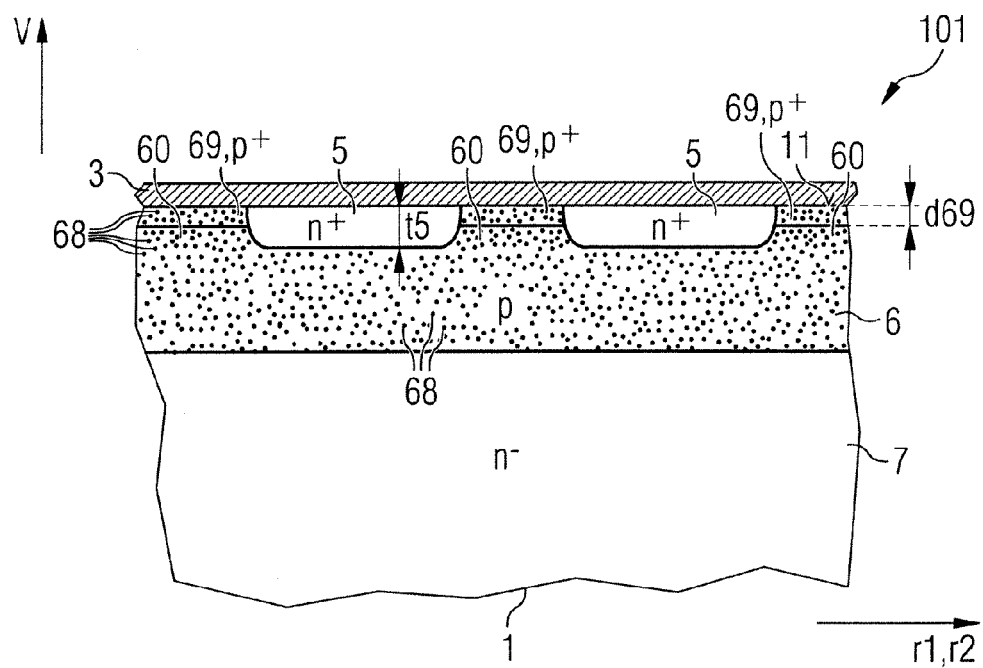
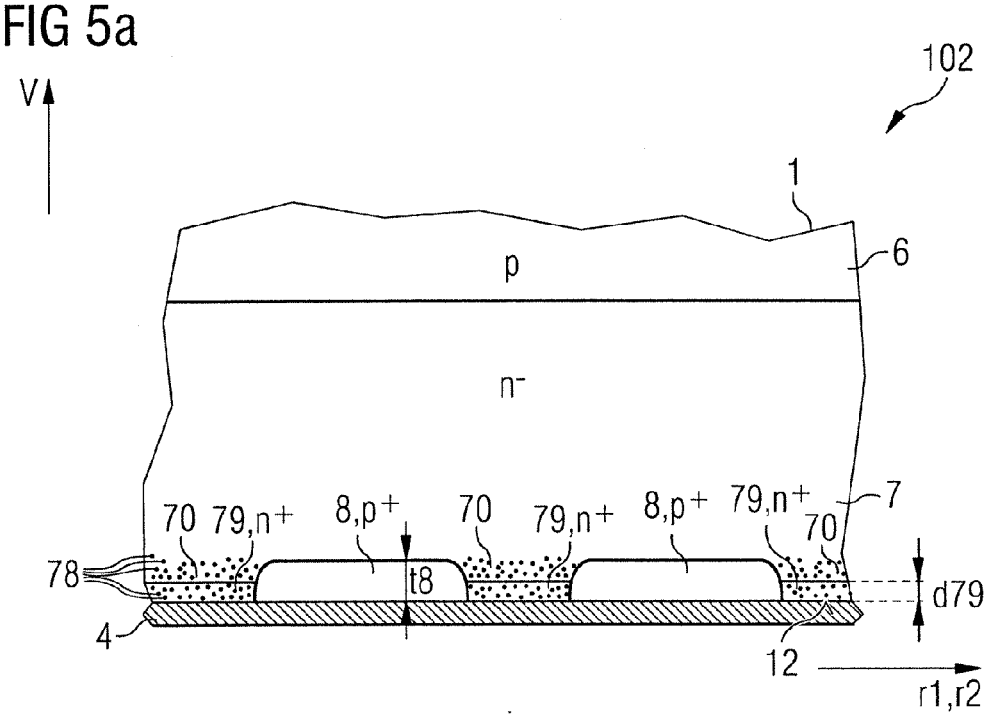

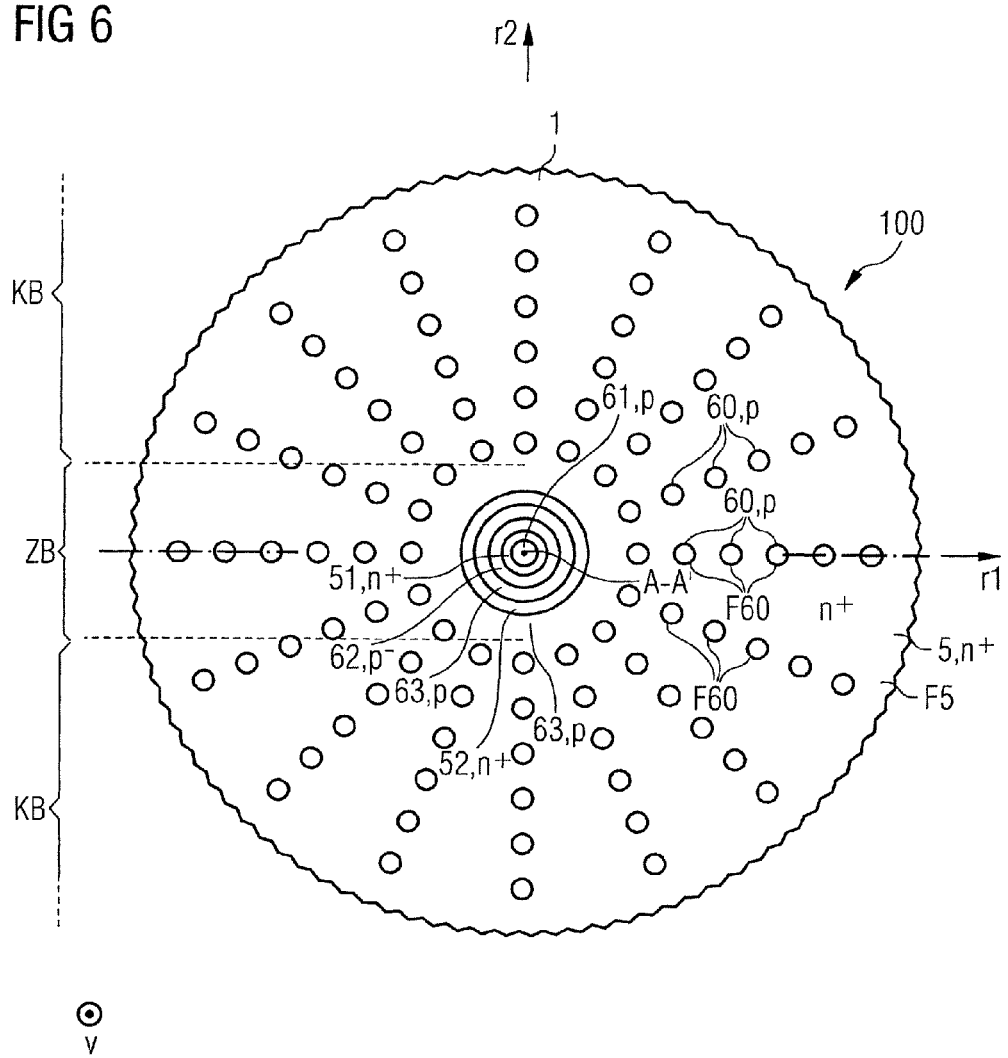

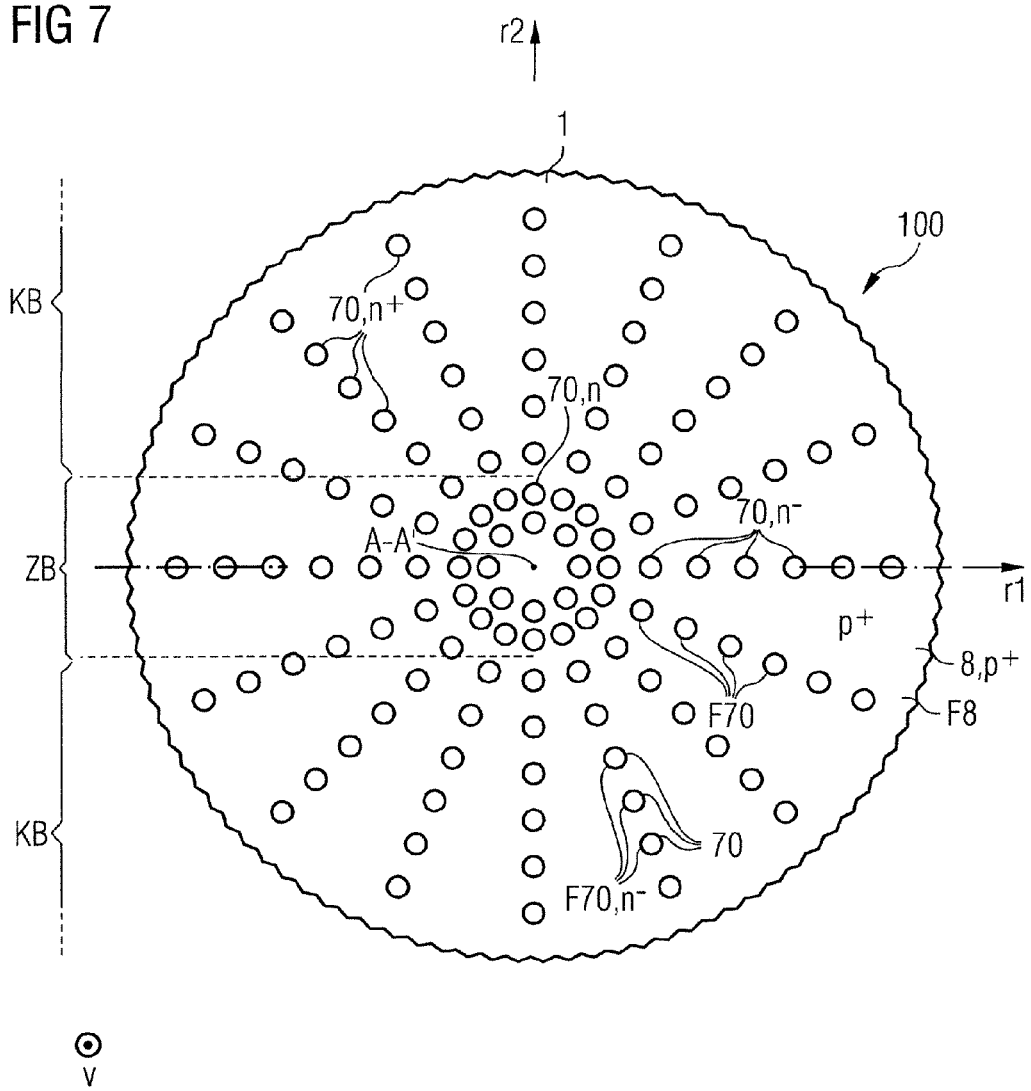

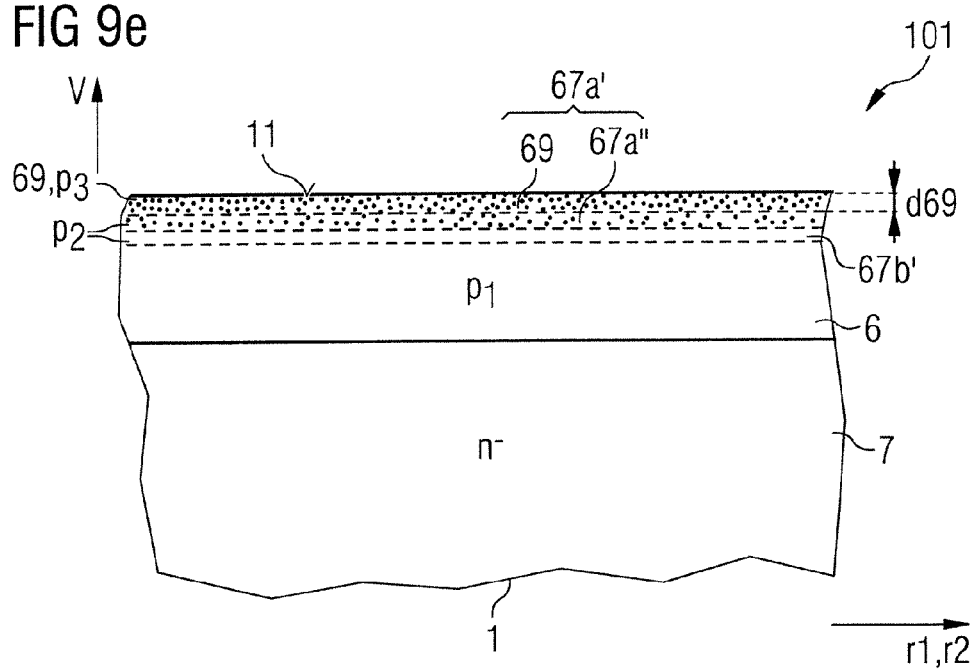
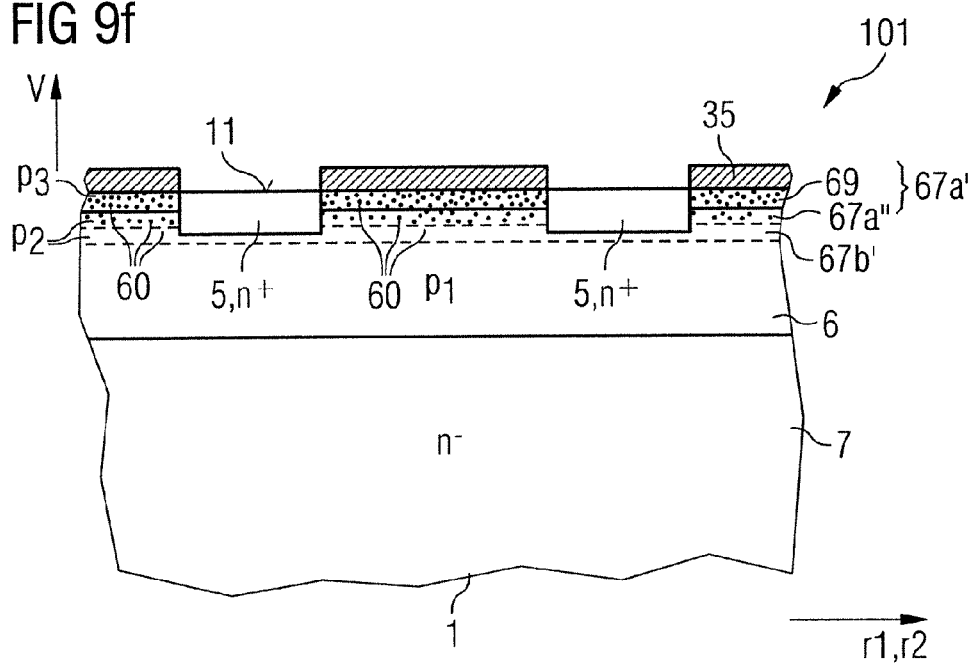

SEMICONDUCTOR COMPONENT INCLUDING A SHORT-CIRCUIT STRUCTURE

CROSS-REFERENCE TO RELATED APPLICATIONS

This Utility Patent Application is a Continuation Application of U.S. Ser. No. 12/324,309, filed Nov. 26, 2008 and claims priority to German Patent Application No. DE 10 2007 057 728.3 filed on Nov. 30, 2007, both of which are incorporated herein by reference.

BACKGROUND

The invention relates to a semiconductor component including a short-circuit structure.

Short-circuit structures such as are used in thyristors, for example, at the pn junction between the n-doped emitter and the p-doped base typically exhibit a positive temperature coefficient of the forward current flowing via the entire short-circuit structure. This is primarily owing to the fact that the electron current injected via the pn junction rises as the temperature of the thyristor increases. However, such short-circuit structures are used not only in thyristors but also, for example, in reverse conducting IGBTs (RC-IB-GTs), in transistors with additional protection function6s (smart power transistors), and also in structures for protection against electrostatic discharge (ESD structures) in semiconductor components.

Due do the positive temperature coefficient of its short-circuit structure, conventional semiconductor components exhibit a significant temperature dependency. Hence, there is a need to provide a semiconductor component and a method for producing a semiconductor component which includes a short-circuit structure exhibiting a reduced temperature dependence.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4c illustrates one embodiment of a thyristor portion corresponding to the thyristor portion in accordance with FIG. 4a, with the difference that the entire p-doped base is doped with the acceptor substance exhibiting an energy level of 100 meV to 500 meV above the valence band.

FIG. 5a illustrates an enlarged embodiment of a thyristor portion which can be seen from FIG. 1 and includes anode short circuits, in which thyristor portion the anode short circuits are doped over their entire region with donors exhibiting an energy level of 100 meV to 500 meV below the conduction band.

FIG. 6 illustrates a horizontal section through an inner portion of the thyristor in accordance with FIG. 1 in a plane B-B'.

FIG. 7 illustrates a horizontal section through an inner portion of the thyristor in accordance with FIG. 1 in a plane C-C'.

FIGS. 9a to 9g illustrate one or more embodiments of a different method for producing a short-circuit structure using the example of a portion 101 of a thyristor as illustrated in FIGS. 1 and 4.

DETAILED DESCRIPTION

Figure 1:
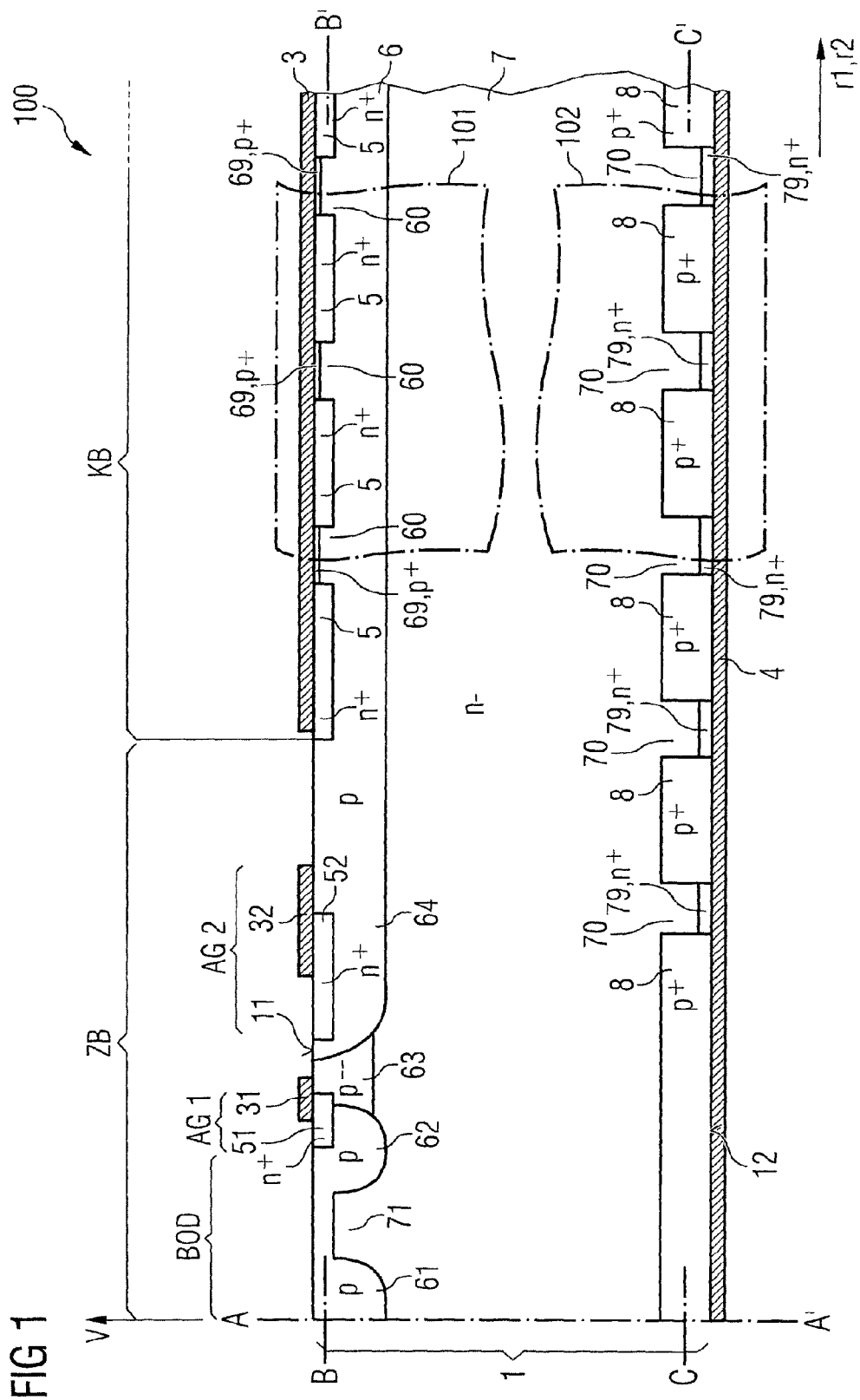
FIG. 1 illustrates one embodiment of a semiconductor component including a vertical section through a portion of a thyristor which includes anodally and cathodally in each case a short-circuit structure connected in each case by using a connection zone to a metallization of the semiconductor body of the thyristor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide for the purpose of doping short-circuit structures in semiconductor components, for the use of doping elements which, at room temperature (300 K), are only incompletely, for example, at most 70%, at least singly ionized, such that the degree of ionization may rise significantly as the temperature increases. In the example of the thyristor described in the introduction, the cathodal short-circuit structure includes portions of the p-doped base which are spaced apart from one another and which penetrate through the n-doped emitter and extend as far as the semiconductor surface.

If these portions are doped with an acceptor which, if it is introduced into the semiconductor body of the thyristor, at a room temperature of 300 K, is only partly, for example, at most 70%, at least singly ionized, then the degree of ionization may still rise significantly as the temperature rises further. In the example chosen, indium is suitable, for example, as dopant for a semiconductor body composed of silicon, indium exhibiting an energy level of approximately 160 meV above the valance band in silicon at a temperature of 300 K. As a result of the rise in temperature, more holes than at room temperature are thus available as charge carriers in the region of the short-circuit structure. As a result, as the temperature rises, the hole current flowing via the short-circuit structure also rises, which brings about a reduction of the gain factor of the transistor formed from the n-doped emitter, the p-doped base including the short-circuit structure and the n-doped base. As a consequence—assuming an acceptor concentration which at elevated temperature produces the same hole concentration as an acceptor that is almost completely ionized at room temperature—at increased temperature significantly fewer electrons from the n-doped emitter are injected into the short-circuit structure than would be the case for a thyristor in which the doping of the short-circuit structure is based on the use of conventional acceptors, for example, aluminum. By way of example, aluminum, incorporated into a silicon semiconductor crystal, at 300 K, is at only a small distance of 67 meV from the valence band edge and at room temperature is therefore already significantly more highly ionized than indium, for example, such that a significant rise in the hole current that reduces the gain factor of the abovementioned transistor is no longer possible.

A corresponding effect may also be utilized in an analogous manner in the case of n-doped short-circuit structures, for example, in the case of anodal short-circuit structures of a thyristor, in order to reduce the temperature dependence of the anodal gain factor. For this purpose, in the example mentioned above, the n-doped emitter should be replaced by the p-doped emitter, the p-doped base should be replaced by the n-doped base, and the n-doped base should be replaced by the p-doped base. Furthermore, the electrons and holes should be interchanged and acceptors should be replaced by donors. The energy gap with respect to the valence band edge is replaced by the energy gap with respect to the conduction band edge.

It goes without saying that the effects portrayed may be used not only in the case of short-circuit structures of thyristors but also in the case of short-circuit structures of other components.

One embodiment provides a semiconductor component that includes a semiconductor body composed of doped semiconductor material, for example, composed of doped silicon. The semiconductor body includes a first zone of a first conduction type and a second zone of a second conduction type, which is complementary to the first conduction type, the second zone adjoining the first zone. The first zone and the second zone are connected to an electrically highly conductive layer, for example, a metallization of the semiconductor body or a layer composed of highly doped polycrystalline semiconductor material. In the case of highly doped polycrystalline semiconductor material, for example, polycrystalline silicon, this may exhibit, for example, a dopant concentration of at least $10^{19}$ cm$^{-3}$. A connection zone of the second conduction type is arranged between the second zone and the electrically highly conductive layer, the connection zone electrically connecting the second zone and the electrically highly conductive layer. If the first conduction type is of the "n" type, the connection zone includes acceptors exhibiting an energy level that lies 100 meV to 500 meV above the valence band of the semiconductor body at a temperature of 300 K. In the other case, where the first conduction type is of the "p" type, the connection zone includes donors exhibiting an energy level that lies 100 meV to 500 meV below the conduction band of the semiconductor body at a temperature of 300 K.

In the method for producing a semiconductor component, firstly a semiconductor body composed of a semiconductor material, for example, composed of silicon, is provided. A first zone of a predetermined first conduction type and a second zone of a second conduction type, which is complementary to the first conduction type, are produced in the semiconductor body. In addition, a connection zone of the second conduction type is produced, which adjoins the second zone and is preferably doped more heavily than the latter.

In addition, an electrically highly conductive layer, for example, a metallization or a layer composed of polycrystalline semiconductor material, is produced, which is electrically conductively connected both to the first zone and to the second zone. The connection zone is produced by introducing a dopant into the semiconductor body. The dopant is chosen such that, after the introduction process, in the case of a predetermined conduction type of the "p" type, the dopant represents an acceptor exhibiting an energy level that lies 100 meV to 500 meV above the valence band of the semiconductor body at a temperature of 300 K. In the case of a predetermined conduction type of the "n" type, a dopant is chosen exhibiting an energy level which, after the introduction process, represents a donor exhibiting an energy level that lies 100 meV to 500 meV below the conduction band of the semiconductor body at a temperature of 300 K.

FIG. 1 illustrates one embodiment of a semiconductor component including a vertical section through a portion of a thyristor 100. The thyristor 100 includes a semiconductor body 1 including differently doped zones, of which optionally some or all zones may be arranged rotationally symmetrically in the semiconductor body 1 with respect to an axis A-A' running in a vertical direction v.

A p-doped emitter 8, an n-doped base 7, a p-doped base 6 and an n-doped emitter 5 are arranged successively in the semiconductor body 1 in the vertical direction v proceeding from a rear side 12 of the semiconductor body 1 toward a front side 11 opposite the rear side 12. The thyristor 100 includes a triggering region ZB and a cathode region KB adjacent to the latter in a lateral direction r1, r2. Within the meaning of the present application, any direction perpendicular to the vertical direction v is designated as lateral direction. Two lateral directions r1, r2 are illustrated by way of example in FIG. 1. On account of the rotational symmetry of the thyristor, the vertical sections are identical in the two directions r1 and r2.

In the cathode region KB, a metallization 3 is applied to the front side 11 of the semiconductor body 1, the metallization making contact with the n-doped emitter 5. Correspondingly, a metallization 4 is applied to the rear side 12 of the semiconductor body 1, the metallization making contact with the p-doped emitter 8 and extending both over the triggering region ZB and over the cathode region KB.

In one embodiment, the triggering region ZB includes a breakover diode BOD formed by virtue of the fact that a portion 71 of the n-doped base 7 extends further in a direction of the front side 11 of the semiconductor body 1 than in all the other regions of the n-doped base 7. The p-doped base 6 includes portions 61, 62, 63, 64 arranged successively in a lateral direction r1, r2. The portion 63 is preferably doped more weakly than the portions 61, 62, 64.

The thyristor 100 furthermore includes a triggering stage structure including two triggering stages AG1, AG2, for example. Instead of two triggering stages AG1, AG2, it is also possible to provide no, one, three, four or more triggering stages arranged successively in a lateral direction r1, r2. Each of the triggering stages AG1, AG2 includes an n-doped triggering stage emitter 51 and 52, respectively, and also a metallization 31 and 32, respectively, which is applied to the front side 11 and makes contact with the triggering stage emitter 51 and 52, respectively, of the relevant triggering stage AG1 and AG2, respectively. The triggering stage emitters 51, 52 project beyond the metallization 31 and 32, respectively, and make contact respectively with metallization 31 and 32 on the side thereof which faces the breakover diode BOD.

On the front side, the thyristor 100 includes a short-circuit structure formed by virtue of the fact that portions 60 of the p-doped base 6 penetrate through the n-doped emitter 5 and extend as far as the front side 11 of the semiconductor body 1. In order to improve the electrical linking of the p-doped base 6 to the cathode metallization 3, a connection zone 69 is in each case arranged between the cathode metallization 3 and the portions 60, the connection zone exhibiting the conduction type of the portions 60 and the p-type doping being increased in the connection zone by comparison with the regions of the portions 60 which adjoin the connection zone 69. The connections zones 69 thus form a structured contact layer by which the p-doped base 6 is connected to the cathode metallization 3 in low-impedance fashion. This contact layer and thus also the connection zones 69 may extend, for example, as far as the front side 11 of the semiconductor body 1 and make contact directly with the electrically highly conductive layer 3.

Furthermore, the thyristor is provided with a short-circuit structure anodally, too, which short-circuit structure is formed analogously to the cathodal short-circuit structure but is doped complementarily with respect thereto. The anodal short-circuit structure is formed by virtue of the fact that portions 70 of the n-doped base 7 penetrate into the p-doped emitter 8 and are electrically connected to the anode metallization 4. A connection zone 79 of the conduction type of the portions 70 is arranged between each of the portions 70 and the anode metallization 4, the n-type doping being increased in the connection zone by comparison with the portions 70. The connection zones 79 together form a structured contact layer 79 by which the n-doped base 7 is connected to the anode metallization 4 in low-impedance fashion.

The cathodal short-circuit structure with its cathode short circuits 60 exhibits a positive temperature coefficient, that is to say that the current flowing via the entire cathodal short-circuit structure with the cathode short circuits 60 rises as the temperature of the semiconductor body 1 increases. In order to counteract the temperature dependence of the gain factor of the cathodal partial transistor composed of the n-doped emitter 5, the p-doped base 6 and the n-doped base 7, the connection zones 69 are doped with an acceptor exhibiting an energy level which—if the acceptor is incorporated into the semiconductor body 1—lies 100 meV to 500 meV or, for example, 100 meV to 300 meV above the valence band of the semiconductor body 1 at a temperature of the semiconductor body 1 of 300 K. Indium, for example, is suitable as acceptor for a semiconductor body 1 composed of the basic material silicon.

The same principle is applied anodally to anode short circuits 70 in order to reduce the temperature dependence of the anodal partial transistor composed of the p-doped base 6, the n-doped base 7 and the p-doped emitter 8. However, since the anode short circuits 70 exhibit a complementary doping with respect to the cathode short circuits 60, the connection zones 79, instead of being doped with an acceptor, are doped with a donor exhibiting an energy level which—if the donor is incorporated into the semiconductor body 1—lies 100 meV to 500 meV or, for example, 100 meV to 300 meV below the conduction band of the semiconductor body 1 at a temperature of the semiconductor body 1 of 300 K. Sulfur and/or selenium, for example, are suitable as donors for a semiconductor body 1 composed of the basic material silicon. Instead of the silicon mentioned here by way of example as basic material for the semiconductor body 1 and/or instead of the dopants indium, sulfur and selenium mentioned by way of example, it is also possible to use other semiconductor basic materials and/or dopants as long as the dopants exhibit in the semiconductor basic material an energy level in the range of the above-mentioned energy gaps relative to the respective band edges $E_L$ and $E_V$.

In one embodiment, an acceptor incorporated into the semiconductor body 1 is particularly effective if it exhibits no energy level in the range of between $E_V$ and $E_V+100$ meV at a temperature of the semiconductor body of 300 K. Correspondingly, a donor incorporated into the semiconductor body 1 is particularly effective if it exhibits no energy level in the range of between $E_L-100$ meV and $E_L$ at a temperature of the semiconductor body of 300 K.

Figure 2:
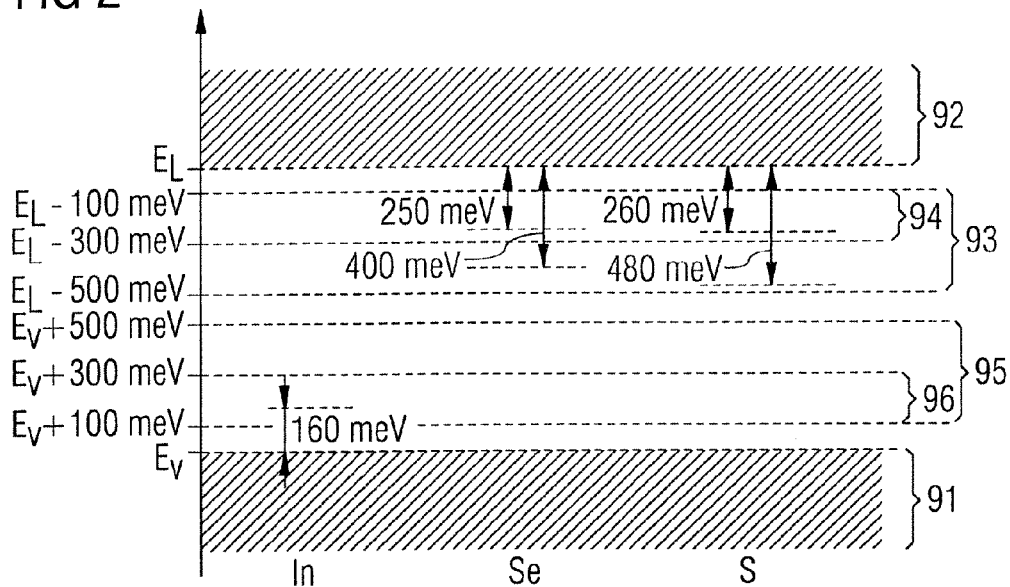
FIG. 2 illustrates one embodiment of an energy level diagram illustrating the band structure of a silicon semiconductor body, in which energy levels of the dopants indium, selenium and sulfur are additionally illustrated, at a temperature of 300 K.

FIG. 2 illustrates an energy level diagram of a semiconductor body exhibiting the basic material silicon at a temperature of 300 K. In the energy level diagram, the energy E increases upward. The band structure includes a valence band 91 with an energy $E_V$ at the upper band edge. Spaced apart from the valence band 91 in the direction of higher energies there is the conduction band 92 with an energy level $E_L$ at the lower band edge. At a temperature of 300 K, the difference $E_L-E_V$ is approximately 1.12 eV.

Dopants incorporated into the semiconductor body may exhibit energy levels that lie above the upper band edge $E_V$ of the valence band 91 and below the lower band edge $E_L$ of the conduction band 92. Indium, selenium and sulfur are illustrated by way of example as dopants in FIG. 2. Indium is an acceptor for silicon and exhibits an energy level of approximately 160 meV above the upper band edge $E_V$ of the valence band 91 at 300 K. By contrast, selenium and sulfur are donors for silicon and exhibit in each case two energy levels between the valence band 91 and the conduction band 92. Relative to room temperature, selenium exhibits energy levels at approximately 250 meV and at 400 meV below the band edge $E_L$ of the conduction band 92. Correspondingly, sulfur exhibits energy levels at approximately 260 meV and 480 meV below the band edge $E_L$ of the conduction band 92. As the temperature of the semiconductor body increases, the relevant dopants provide an increasing number of free charge carriers, that is to say electrons in the case of a donor and holes in the case of an acceptor. The illustration likewise illustrates energy ranges 93 of 100 meV to 500 meV below the conduction band edge $E_L$, 94 of 100 meV to 300 meV below the conduction band edge $E_L$, 95 of 100 meV to 500 meV above the valence band edge $E_V$, and 96 of 100 meV to 300 meV above the valence band edge $E_V$.

Figure 3:
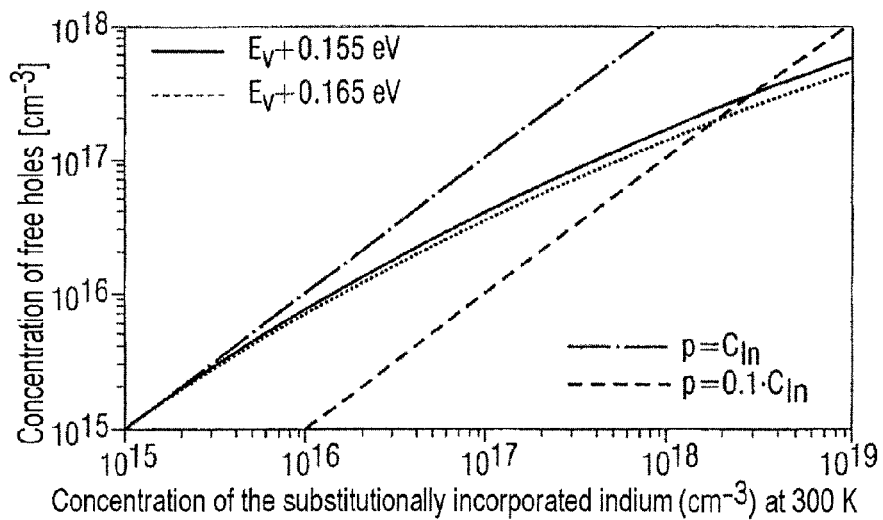
FIG. 3 illustrates a diagram of one embodiment of the concentration of free holes of an indium-doped silicon semiconductor body as a function of the concentration of the substitutionally incorporated indium.

FIG. 3 is a diagram illustrating the concentration of free holes of an indium-doped semiconductor body with the basic material silicon as a function of the concentration of the substitutionally incorporated indium for energy levels of indium of $E_V+0.155$ eV and $E_V+0.165$ eV. It can be seen from this that at 300 K, for indium concentrations of greater than $10^{17}$ cm$^{-3}$, indium exhibits an ionization proportion of significantly less than 70%, that is to say that the substitutionally incorporated indium is only partly ionized at 300 K. As the temperature increases, the ionized indium proportion rises, such that the conductivity of a p-conducting short-circuit region doped therewith rises and the contact resistance between this region and the metallization is reduced.

Figure 4A:
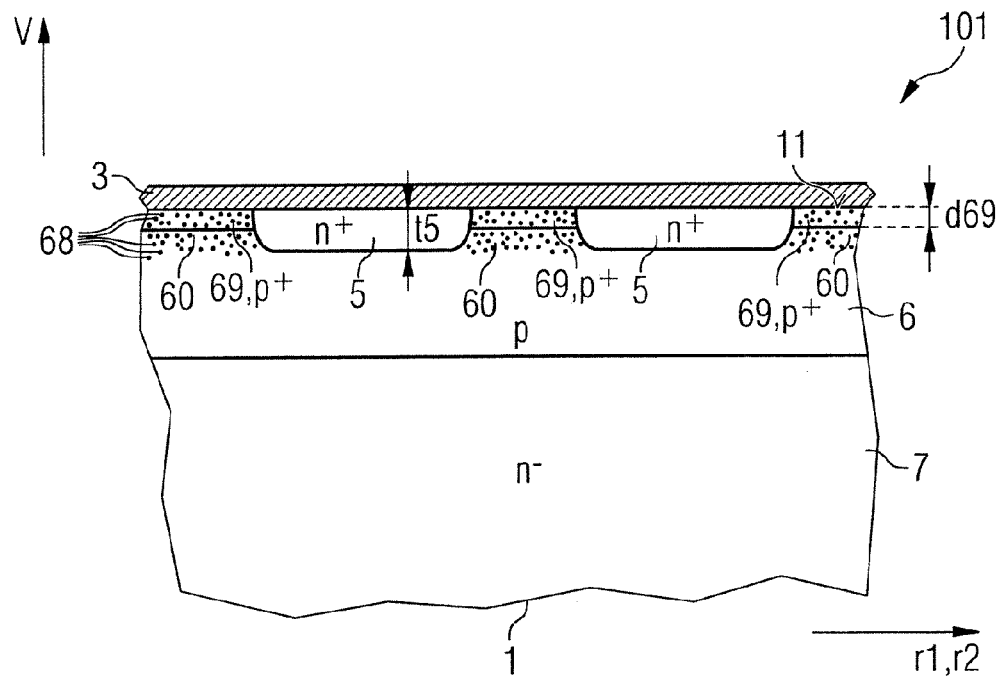
FIG. 4a illustrates an enlarged illustration of a thyristor portion 101 which can be seen from FIG. 1 and includes cathode short circuits, in which thyristor portion the cathode short circuits are doped over their entire region with acceptors exhibiting an energy level of 100 meV to 500 meV above the valence band.

FIG. 4a illustrates an enlarged illustration of the thyristor portion 101 which can be seen from FIG. 1 and includes cathode short circuits 60. The illustration symbolically illustrates acceptors 68 which, if they are introduced into the semiconductor body 1, at a temperature of the semiconductor body 1 of 300 K, exhibit one energy level or a plurality of energy levels which in each case lie 100 meV to 500 meV (range 95 in FIG. 2) or else e.g., only 100 meV to 300 meV (range 96 in FIG. 2) above the band edge $E_V$ of the valence band 91. The region of the doping with such acceptors 68 may extend e.g., in the vertical direction v over the entire region of the cathode short circuits 60, that is to say into the depth t5 of the n-doped emitter 5. Preferably, the connection zones 69 are produced using an acceptor that is at most 70% ionized at 300 K (FIG. 4b), wherein the vertical extent d69 of the connection zone 69 is smaller than t5. The thickness d69 may, for example, also be chosen in such a way that it deviates by less than 10% from the depth t5. As is additionally illustrated in FIG. 4c, the doping with an acceptor which is ionized at most 70% at 300 K may extend in the vertical direction v also over the entire p-doped base 6, wherein the connection zones 69 are doped more heavily with this acceptor than the p-doped base 6.

Figure 4B:
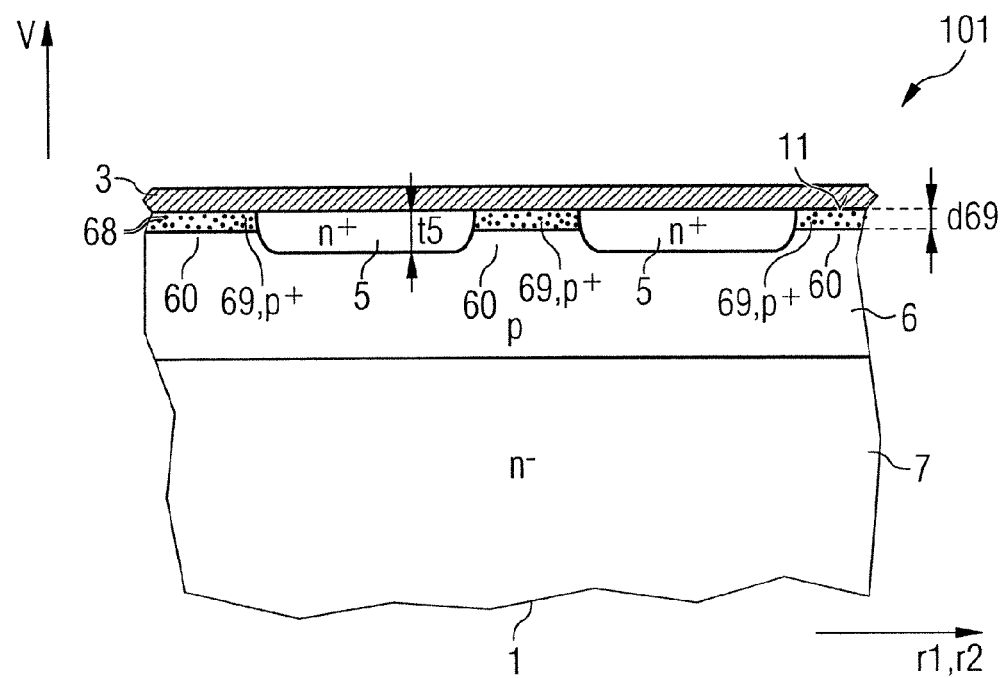
FIG. 4b illustrates a portion 101 which corresponds to the portion 101 in accordance with FIG. 4a but in which the cathode short circuits include acceptors exhibiting an energy level of 100 meV to 500 meV above the valence band only in the region of the connection zone.

The thickness d69 of the contact layer 69 as can be seen from FIGS. 4a, 4b, 4c may be 0.5 μm to 20 μm, for example. The concentration of ionized acceptors that is present at room temperature may be, for example, $10^{16}$ cm$^{-3}$ to $10^{18}$ cm$^{-3}$ or, for example, $10^{16}$ cm$^{-3}$ to $10^{17}$ cm$^{-3}$.

Figure 5B:
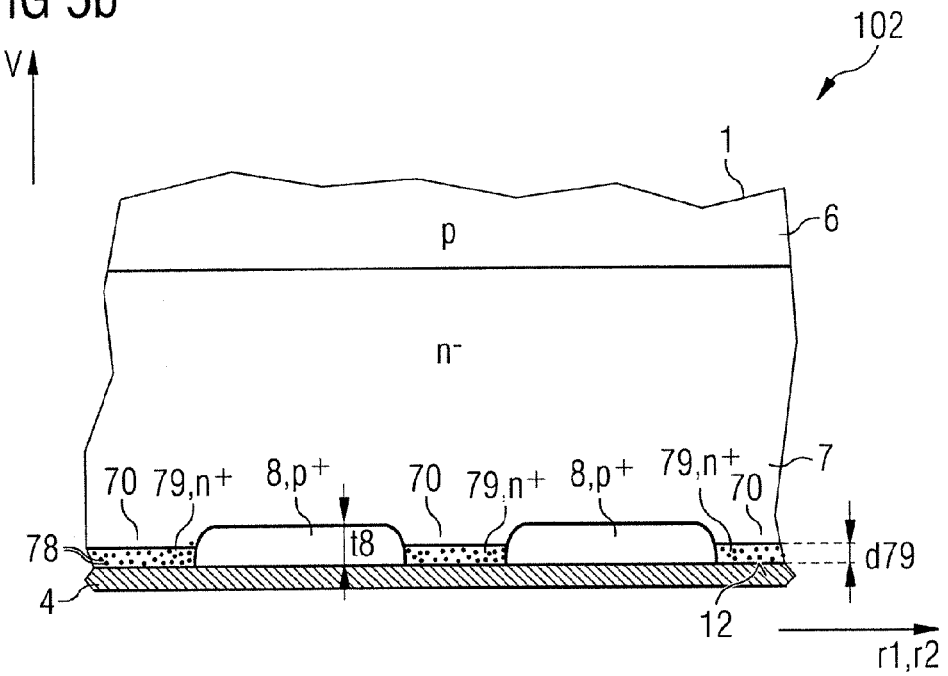
FIG. 5b illustrates a portion which corresponds to the portion in accordance with FIG. 5a but in which the anode short circuits include donors exhibiting an energy level of 100 meV to 500 meV below the conduction band only in the region of the connection zone.
Figure 5C:
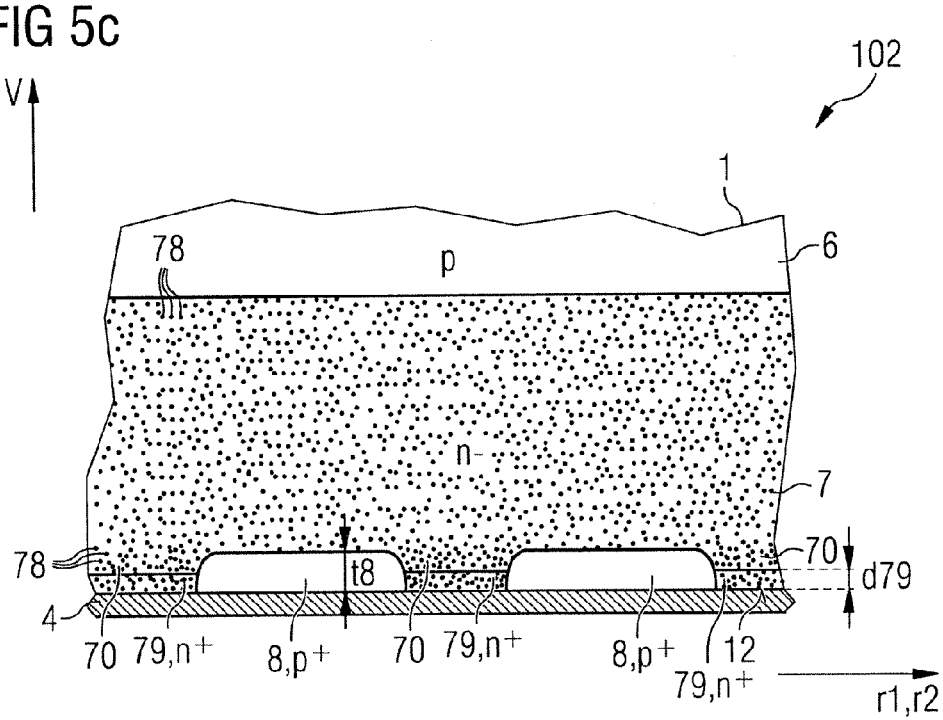
FIG. 5c illustrates one embodiment of a thyristor portion corresponding to the thyristor portion in accordance with FIG. 5a, with the difference that the entire n-doped base is doped with the donor substance exhibiting an energy level of 100 meV to 500 meV below the conduction band.

FIGS. 5a, 5b, 5c illustrate one or more embodiments of the thyristor portions 102 which can be seen from FIG. 1 and which are analogous to the embodiments in accordance with FIGS. 4a, 4b, 4c with regard to the functioning of the short-circuit structure respectively illustrated—in the stated order.

Whereas p-doped cathode short circuits 60 were explained with reference to FIGS. 4a to 4c, the embodiments in accordance with FIGS. 5a to 5c relate to n-doped anode short circuits 70. In this case, the donors 78 used for doping the connection zones 79 are chosen in such a way that—when incorporated into the semiconductor body 1—at a temperature of the semiconductor body 1 of 300 K, they exhibit at least one energy level which, in the semiconductor body 1 based on silicon, for example, lies 100 meV to 500 meV (see range 93 in FIG. 2) or, for example, 100 meV to 300 meV (see range 94 in FIG. 2) below the lower band edge $E_L$ of the conduction band 92. As can be seen from FIG. 5a, the region including the donors 78 may extend in the vertical direction v over the entire region of the p-doped emitter 8, that is to say as far as the depth t8 of the p-doped emitter 8. Preferably, the connection zones 79 are produced using a donor 78 that is ionized at most 70% at 300 K (FIG. 5b), wherein the vertical extent d79 of the connection zone 79 is smaller than t8. As is additionally illustrated in FIG. 5c, the doping with a donor ionized at most 70% at 300 K may extend in the vertical direction v also over the entire n-doped base 7, wherein the connection zones 79 are doped more heavily with this donor than the n-doped base 7.

The thickness d79 of such a contact layer 79 may be 0.5 μm to 20 μm, for example. The concentration—present at room temperature—of ionized donors in the portions in which the dopants 78 are provided may be, for example, $10^{15}$ cm$^{-3}$ to $10^{20}$ cm$^{-3}$ or, for example, $10^{16}$ cm$^{-3}$ to $10^{19}$ cm$^{-3}$.

FIG. 6 illustrates a horizontal section through the triggering region ZB and a portion—adjoining the latter—of the cathode region KB in a sectional plane B-B' which can be seen from FIG. 1 and runs parallel to the substantially planar front side 11 of the thyristor. In conjunction with FIG. 1 it can be discerned that the cathode short circuits 60 may be embodied in pillar-like fashion. In the sectional view in accordance with FIG. 6, the cathode short circuits 60 exhibit cross-sectional areas F60. These cross-sectional areas F60 may be chosen to be identical in size for all cathode short circuits 60. As an alternative to this, however, there is also the possibility of different cathode short circuits 60 exhibit different cross-sectional areas F60. In a departure from the illustration in FIG. 6, the cathode short circuits 60 need not necessarily exhibit circular cross sections, but rather may be shaped as desired. In addition, the cathode short circuits 60 need not necessarily be embodied in pillar-like fashion. By way of example, it is also possible to provide a cathodal short-circuit structure that is ramified in net-like, grid-like and tree-like fashion. What is crucial is that the n-doped emitter 5 is pervaded by cathode short circuits 60 sufficiently densely over its entire cross-sectional area in the sectional plane B-B'.

The cathodal short-circuit structure may be configured, for example, in such a way that in the cross-sectional plane B-B' in accordance with FIG. 6, no location of the n-doped emitter 5 is further than a predetermined value, for example, 1000 μm in the case of thyristors exhibiting blocking voltages >5 kV and nominal currents >4 kA, away from a cathode short circuit 60. The sum of the cross-sectional areas F60 of all the cathode short circuits 60 provided in the region of the n-doped emitter 5 may amount, for example, to between 0.1 and 10% or between 0.4% and 5% of the sum of all the cross-sectional areas F5 of the n-doped emitter 5 and all the cross-sectional areas F60 of the cathode short circuits 60 in the sectional plane B-B'.

FIG. 7 illustrates a horizontal section through a sectional plane C-C' through the anodal short circuits 70 (anode short circuits), which sectional plane is illustrated in FIG. 1 and runs parallel to the sectional plane B-B' and to the rear side 12. The spatial configuration of the anodal short-circuit structure with the anode short circuits 70 may be chosen in the same way as a cathodal short-circuit structure with the cathodal short circuits 60 in accordance with FIGS. 1 and 6. In one embodiment, the anode short circuits 70 may be embodied as ramified in pillar-like, net-like, grid-like and tree-like fashion. In the sectional plane C-C', the anode short circuits 70 exhibit cross-sectional areas F70. These cross-sectional areas F70 may be chosen to be identical in size for all the anode short circuits 70. As an alternative to this, however, there is also the possibility of different anode short circuits 70 exhibiting different cross-sectional areas F70.

What is crucial is that the p-doped emitter 8 is pervaded by anode short circuits 70 sufficiently densely over its entire cross-sectional area F8 in the sectional plane C-C'. The anodal short-circuit structure may be configured, for example, in such a way that in the sectional plane C-C', no location of the p-doped emitter 8 is further than a predetermined value, for example, 1000 µm in the case of thyristors exhibiting blocking voltages >5 kV and nominal currents >4 kA, away from an anode short circuit 70. The sum of the cross-sectional areas F70 of all the anode short circuits 70 provided in the region of the p-doped emitter 8 may amount, for example, to between 0.1% and 10% or between 0.4% and 5% of the total area of all the cross-sectional areas F8 of the n-doped emitter 8 and all the cross-sectional areas F70 of the anode short circuits 70 in the sectional plane C-C'. In contrast to the cathode short circuits 60 (see FIGS. 1 and 6), anode short circuits 70 may also be arranged in the triggering region ZB.

Figure 8A:
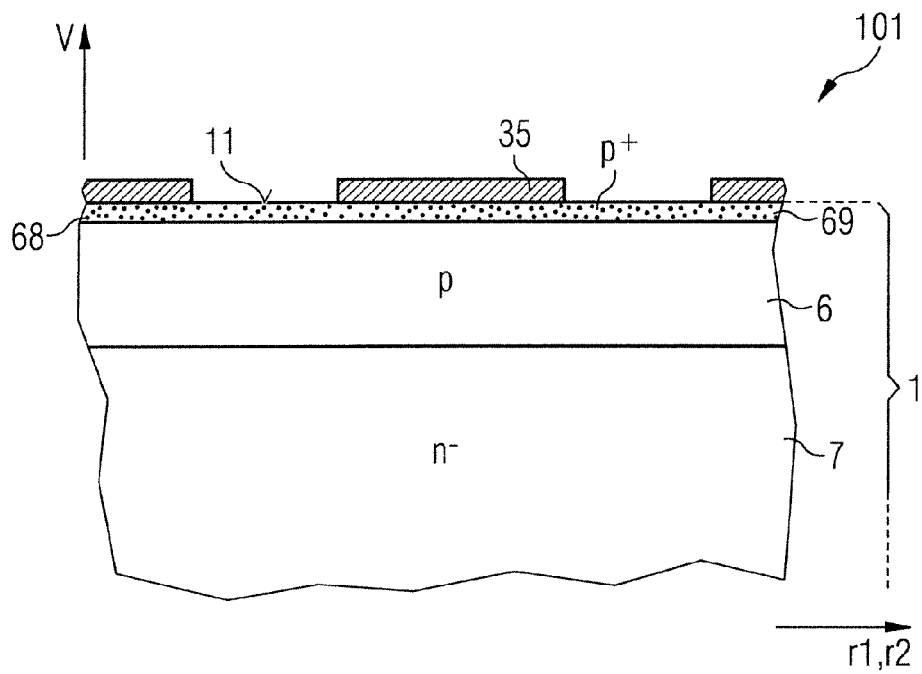
FIG. 8a illustrates one embodiment of a method for producing a short-circuit structure of a semiconductor component using the example of the thyristor portion 101 illustrated in FIGS. 1 and 4.

One possibility for producing such short-circuit structures is explained below with reference to FIGS. 8a and 8b on the basis of the example of the cathode short circuits 60 in accordance with FIG. 4b. After a weakly n-doped semiconductor body 1 has been provided, a p-doped layer 6 is produced, for example, epitaxially or by front-side diffusion, the layer extending as far as the front side 11 of the semiconductor body 1. Afterward, proceeding from the front side 11, acceptors 68 are introduced into the semiconductor body 1, the acceptors—in the introduced state—exhibiting one or a plurality of energy levels that lie 100 meV to 500 meV, or, for example, 100 meV to 300 meV, above the upper band edge $E_V$ of the valence band 91 (see FIG. 2) of the semiconductor body 1 at a temperature of the semiconductor body 1 of 300 K. A patterned mask 35 is then applied to the front side 11, which is illustrated as the result in FIG. 8a.

Figure 8B:
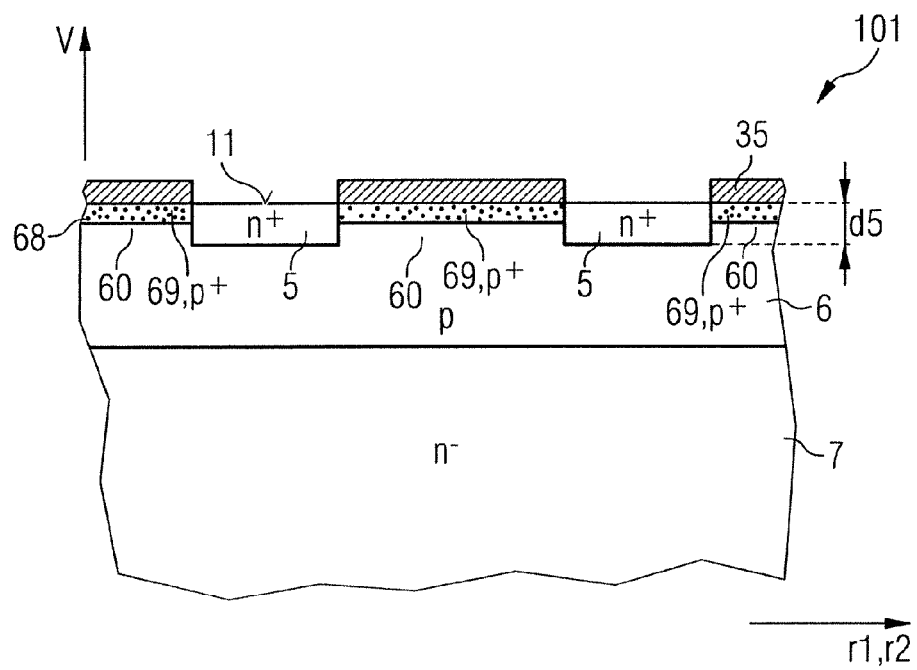
FIG. 8b illustrates one embodiment of the method for producing a short-circuit structure of a semiconductor component, in which the n-doped emitter of the thyristor is produced.

Using the patterned mask 35, donors are introduced into the semiconductor body 1, with the result that the heavily n-doped zones 5 arise, as are illustrated in FIG. 8b.

Figure 9A:
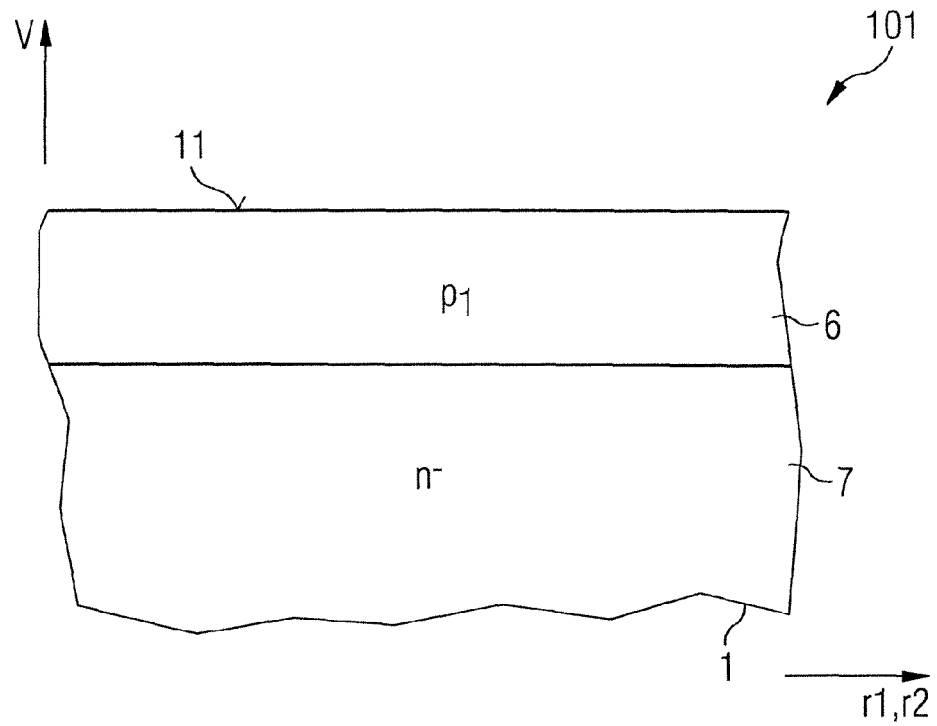
Figure 9B:
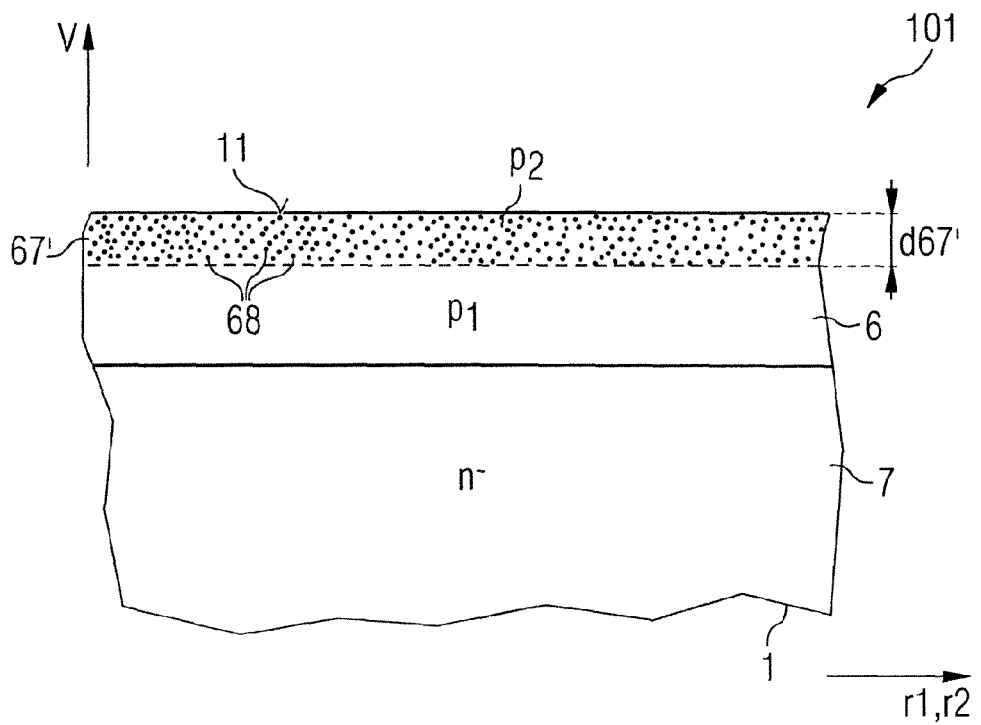

A further possibility for producing a short-circuit structure of a semiconductor component is explained below with reference to FIGS. 9a to 9g. For this purpose, firstly a semiconductor body 1 is provided, which exhibits a weakly n-doped zone 7 and also a p-doped zone 6, which is arranged between a front side 11 of the semiconductor body 1 and the weakly n-doped zone 7 and which exhibits a dopant concentration p1. Afterward, as illustrated in FIG. 9b, acceptors 68 are introduced into the semiconductor body 1, such that a zone 67' exhibiting a dopant concentration p2 arises. The zone 67' may extend as far as the front side 11 as illustrated, or in one embodiment it may be spaced apart from the front side.

In their state incorporated into the semiconductor body 1, the acceptors 68 exhibit at least one energy level that lies 100 meV to 500 meV, or, for example, 100 meV to 300 meV, above the valence band $E_V$ of the semiconductor body 1 (see FIG. 2) at a temperature of the semiconductor body 1 of 300 K. Indium, for example, is suitable as acceptor for a semiconductor body 1 composed of the basic material silicon. As is illustrated in FIG. 9b, the zone 67', as measured from the front side 11, may extend into a depth d67' of, for example, 0.5 to 20 µm or of, for example, 1 µm to 10 µm. The dopant 68 may be introduced by implantation and/or diffusion into the semiconductor body 1.

Figure 9C:
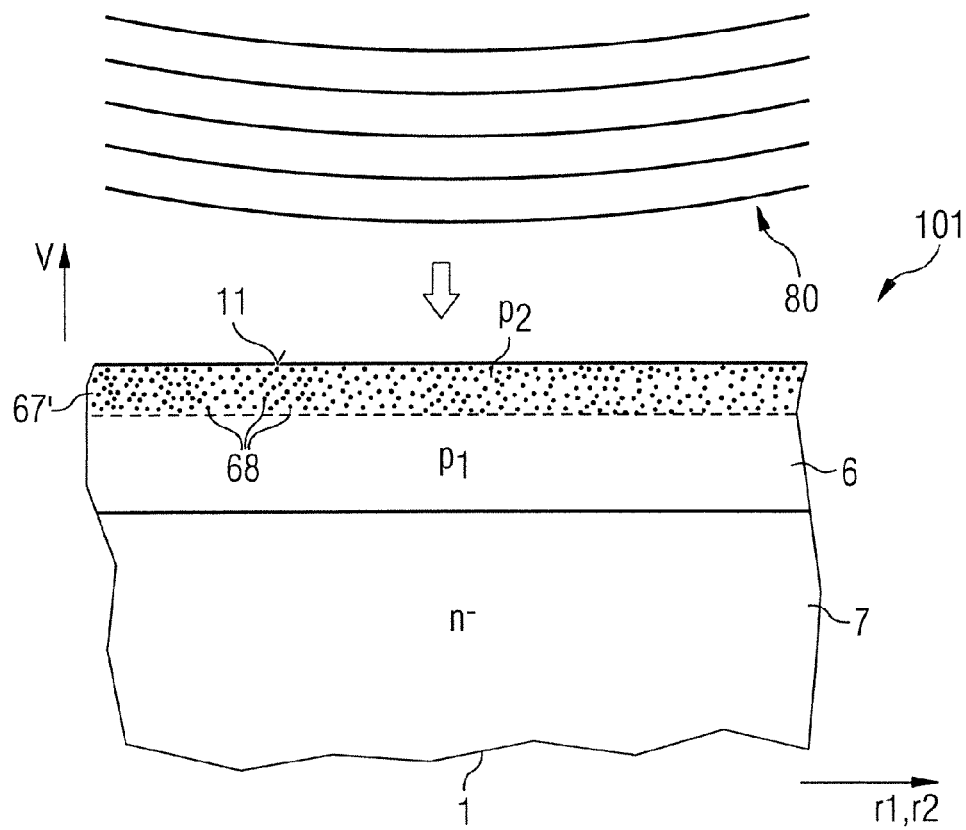
Figure 9D:
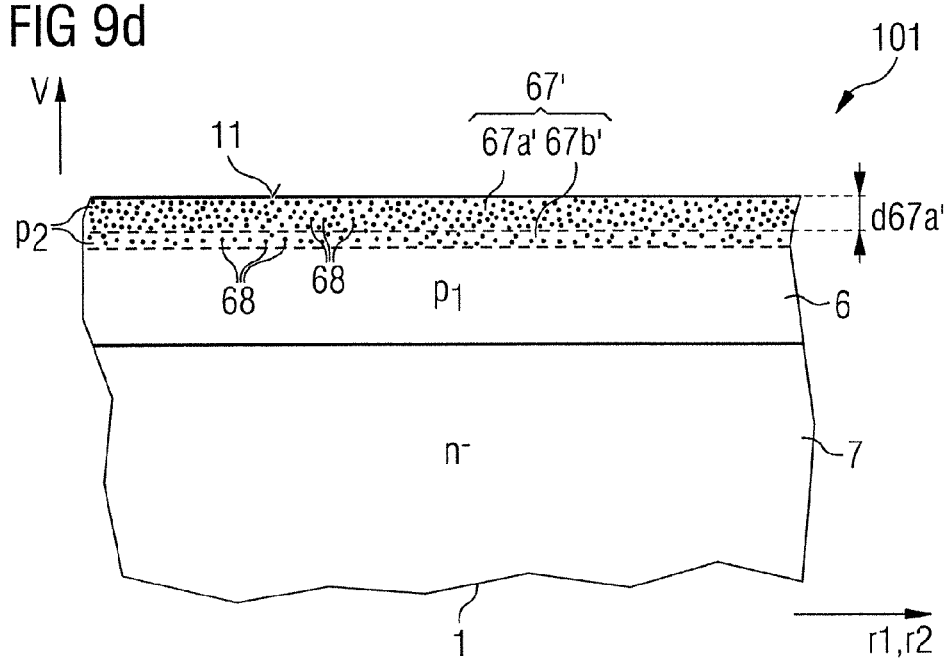
Figure 9G:
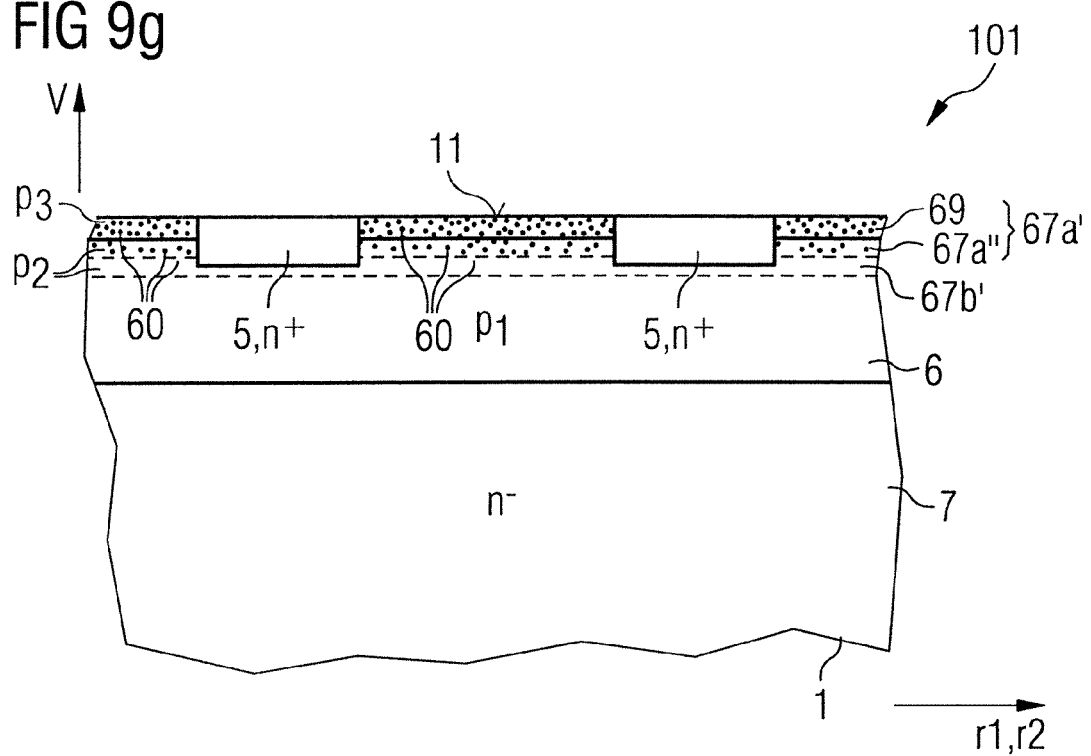

Optionally, for activating the dopant 68 after the dopant 68 has been introduced, a brief thermal annealing process may be effected, in which the semiconductor body 1 is heated to an elevated temperature at least in a region into which dopants 68 were introduced. The thermal annealing may be effected by using an RTP process (RTP=rapid thermal processing), for example, in which the semiconductor body 1 is heated to a temperature of 800° C. to 1250° C. for a process time of 5 seconds to 60 seconds. As an alternative or in addition, there is the possibility of providing an annealing process using a laser (laser annealing), which is illustrated in FIG. 9c. In order to activate the dopants 68 introduced into the semiconductor body 1 on the front side, a laser pulse 80 is directed onto the front side 11 of the semiconductor body 1, such that, at the front side 11, the region of the semiconductor body 1 near the surface is momentarily melted and subsequently recrystallized, whereby the substitutionally incorporated proportion of the dopant 68 is significantly larger than in the case of a conventional activation process in which the silicon temperature is usually kept below the melting point. For this purpose, the laser pulse 80 may exhibit at the peak value an energy density of 3 J/cm$^2$ to 5 J/cm$^2$, for example. The duration of the laser pulse 80 may be chosen to be less than 500 ns (1/e value of the laser power; e=2.7182 . . . "Euler's constant"). The melting of the semiconductor body 1 near the surface that is brought about by the laser pulse 80 need not necessarily take place in the entire zone 67'. By way of example, it is also possible for only a partial zone 67a' of the zone 67' to be melted, while a remaining partial zone 67b' of the zone 67' is not melted, which can be seen as the result from FIG. 9d. The partial zone 67a' is arranged between the partial zone 67b' and the front side 11 of the semiconductor body 1 and may extend as far as the front side 11. Its thickness d67a' may be 0.2 µm to 5 µm, for example. Likewise, it is also possible for only a lateral partial region of the zone 67' to be melted.

As an alternative to only partial melting of the zone 67', the temporary melting of the semiconductor body 1 by using the laser pulse 80 may also extend over the entire zone 67' containing the dopant 68, or even beyond the zone (not illustrated).

As is illustrated in FIG. 9e, it is optionally possible, for improving the electrical linking of the p-doped zone 6 to a metallization 3 to be applied later to the front side 11 (see e.g., FIG. 1), also to produce a heavily p-doped connection zone 69 exhibiting a dopant concentration p3, which extends as far as the front side 11 of the semiconductor body 1. The dopant concentration p3 may be chosen to be e.g., greater than each of the dopant concentrations p1 and p2, but also to be less than p2. The thickness d69 of the connection zone 69 may be chosen to be smaller than the thickness d67' that can be seen in FIG. 9b.

Afterward—as can be seen from FIG. 9f and has already been explained with reference to FIGS. 8a and 8b—a patterned mask 35 may be applied to the front side 11 and the heavily n-doped emitter 5 may be produced.

The invention has been explained above using the example of a thyristor with short-circuit structure realized in a semiconductor body including the basic material silicon. However, the invention also encompasses other components with a short-circuit structure, for example, IGBTs, RC-IGBTs, power MOSFETS or components including ESD structures.

Instead of silicon, any other semiconductor material, for example, silicon carbide or gallium arsenide, may also be provided as the basic material. Suitable dopants for producing p-doped short-circuit regions (see e.g., the cathode short circuits 60 in FIGS. 1, 4a to 4c, 6, 8b, 9f and 9g) include acceptors which—if they are introduced into the semiconductor body of the component—exhibit at least one energy level that lies within the range of 100 meV to 500 meV or within the range of 100 meV to 300 meV above the upper band edge of the valence band of the relevant semiconductor material.

Correspondingly, suitable dopants for producing n-doped short-circuit regions (see e.g., the anode short circuits 70 in FIGS. 1, 5a to 5c and 7) include donors which—if they are introduced into the semiconductor body of the component—exhibit at least one energy level that lies within the range of 100 meV to 500 meV or within the range of 100 meV to 300 meV below the lower band edge of the conduction band of the relevant semiconductor material.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof. Further, is to be understood that features also of different exemplary embodiments described herein may be combined with each other in other embodiments, unless these features do not exclude each other or unless specifically noted otherwise. Features or method processes mentioned in a claim may be combined with features or method processes mentioned in any one or more other claims within the same embodiment, provided that the respective features or method processes do not exclude each other.

What is claimed is:

1. A method comprising:
    producing a first zone of a first conduction type in a semiconductor body;
    producing a second zone of a second conduction type complementary to the first conduction type in the semiconductor body;
    producing a connection zone of the second conduction type in the semiconductor body, the connection zone adjoining the second zone and being more heavily doped than a region of the second zone adjoining the connection zone; and
    producing an electrically conductive layer such that it is electrically connected to the first zone and the second zone,
    wherein producing the connection zone comprises introducing dopant atoms into the semiconductor body,
    wherein the dopant atoms are one of n type dopant atoms and p type dopant atoms,
    wherein p type dopant atoms are selected such that their energy level lies between 100 meV and 500 meV above the valence band of the semiconductor body at a temperature of 300 K,
    wherein n type dopants are selected such that their energy level lies between 100 meV and 500 meV below the conduction band of the semiconductor body at a temperature of 300 K,
    wherein producing the connection zone comprises annealing the semiconductor body in a region that contains at least a part of the dopant atoms and that is near the surface of the semiconductor body by temporarily melting the region by using a laser pulse; and
    wherein forming the connection zone comprises forming the connection zone not to extend substantially deeper into the semiconductor body than the first zone.

2. The method of claim 1, wherein forming the connection zone further comprises forming the connection zone to have a maximum thickness less than a maximum thickness of the first zone in a direction perpendicular to the electrically highly conductive layer.

3. The method of claim 1, wherein the dopants are selected such that at a temperature of 300 K at most 70% of the dopant atoms are ionized.

4. The method of claim 1, wherein the dopant atoms are acceptors exhibiting an energy level that lies between 100 meV and 300 meV above the valence band of the semiconductor body at a temperature of 300 K.

5. The method of claim 4, wherein the acceptors are indium atoms.

6. The method of claim 1, wherein the dopant atoms are donors exhibiting an energy level that lies between 100 meV and 300 meV below the conduction band of the semiconductor body at a temperature of 300 K.

7. The method of claim 6, wherein the dopant atoms are selenium and/or sulfur atoms.

8. The method of claim 1, further comprising:
    before producing the electrically conductive layer, producing the connection zone in the semiconductor body such that the connection zone directly adjoins the second zone, extends as far as the surface of the semiconductor body, and is more heavily doped than the regions of the second zone that adjoin the connection zone.

9. The method of claim 1, wherein the pulse duration, relative to the 1/e value of the power of the laser pulse, is less than 500 ns.

10. The method of claim 1, wherein the semiconductor body comprises silicon.

11. A method, comprising:
    producing a first zone of a predetermined first conduction type in a semiconductor body;
    producing a second zone of a second conduction type complementary to the first conduction type in the semiconductor body;
    producing a connection zone of the second conduction type in the semiconductor body, the connection zone adjoining the second zone and being more heavily doped than adjoining region of the second zone adjoining the connection zone; and
    producing an electrically conductive layer such that it is electrically connected to the first zone and the second zone,
    wherein producing the connection zone comprises introducing dopant atoms into the semiconductor body,
    wherein the dopant atoms are one of n type dopant atoms and p type dopant atoms,
    wherein p type dopant atoms are selected such that their energy level lies between 100 meV and 500 meV above the valence band of the semiconductor body at a temperature of 300 K,
    wherein n type dopants are selected such that their energy level lies between 100 meV and 500 meV below the conduction band of the semiconductor body at a temperature of 300 K; and wherein producing the connection zone comprises activating the dopant atoms by a thermal annealing process in which the semiconductor body, at least in a region into which the dopant atoms were introduced, is heated to a temperature of between 800° C. and 1250° C. for a process time of between 5 seconds and 60 seconds;

wherein forming the connection zone comprises forming the connection zone not to extend substantially deeper into the semiconductor body than the first zone.

12. The method of claim 11, wherein forming the connection zone further comprises forming the connection zone to have a a maximum thickness less than a maximum thickness of the first zone in a direction perpendicular to the electrically conductive layer.

13. The method of claim 11, wherein the semiconductor body comprises silicon.

* * * * *